(12) United States Patent
Peck et al.

(10) Patent No.: US 7,825,672 B2
(45) Date of Patent: Nov. 2, 2010

(54) HIGH ACCURACY IN-SITU RESISTANCE MEASUREMENTS METHODS

(75) Inventors: Kevin B. Peck, Sonora, CA (US); Noel Johnson, Sonora, CA (US); Björn Å. Larsson, Västerås (SE); Pontus K. H. Nilsson, Oakdale, CA (US)

(73) Assignees: MRL Industries, Inc., Sonora, CA (US); Sandvik Intellectual Property AB, Sandviken (SE)

( * ) Notice: Subject to any disclaimer, the term of this patent is extended or adjusted under 35 U.S.C. 154(b) by 0 days.

(21) Appl. No.: 11/454,922

(22) Filed: Jun. 19, 2006

(65) Prior Publication Data

US 2007/0290692 A1    Dec. 20, 2007

(51) Int. Cl.
G01R 27/08  (2006.01)
G01R 31/08  (2006.01)

(52) U.S. Cl. .................. 324/713; 324/525
(58) Field of Classification Search ............. 324/713, 324/525
See application file for complete search history.

(56) References Cited

U.S. PATENT DOCUMENTS

| | | | |
|---|---|---|---|
| 4,549,073 A | 10/1985 | Tamura et al. | |
| 4,970,134 A | 11/1990 | Bronstert et al. | |
| 4,982,185 A * | 1/1991 | Holmberg et al. | 340/825.21 |
| 5,280,422 A | 1/1994 | Moe et al. | |
| 5,387,909 A * | 2/1995 | Neel et al. | 340/931 |
| 5,514,129 A * | 5/1996 | Smith | 606/40 |
| 5,552,998 A | 9/1996 | Datta | |
| 5,629,869 A | 5/1997 | Johnson et al. | |
| 5,702,624 A | 12/1997 | Liao et al. | |
| 5,754,451 A | 5/1998 | Williams | |
| 5,831,249 A | 11/1998 | Rohner et al. | |
| 5,864,733 A | 1/1999 | Mae et al. | |
| 6,956,489 B2 | 10/2005 | Peck et al. | |
| 7,012,538 B2 | 3/2006 | Peck et al. | |
| 2004/0012498 A1* | 1/2004 | Peck et al. | 340/640 |
| 2004/0060026 A1* | 3/2004 | Stanley | 716/10 |
| 2004/0108824 A1* | 6/2004 | Ueda et al. | 318/114 |

OTHER PUBLICATIONS

Singapore Written Opinion, dated Jan. 5, 2010, 9 pages.

* cited by examiner

*Primary Examiner*—Jeff Natalini
(74) *Attorney, Agent, or Firm*—Drinker Biddle & Reath LLP

(57) ABSTRACT

Methods to determine an instantaneous resistance value of an electric circuit and a measurement system to determine an instantaneous resistance value of an electric circuit are disclosed. Exemplary embodiments of the method measure an in-situ instantaneous voltage of the circuit and an in-situ instantaneous current of the circuit and calculate the instantaneous resistance. Optional temperature measurement can be included in the method and the calculated instantaneous resistance related to the measured temperature. The method can be applied to phase angle fired loads and to zero-cross (time proportioned) loads.

19 Claims, 4 Drawing Sheets

HIGH ACCURACY IN-SITU RESISTANCE MEASUREMENTS METHODS

FIELD

The present disclosure relates to resistance measurements. More particularly, the present disclosure relates to methods of making in-situ resistance measurements and methods for monitoring equipment based on the measurements. For example, the present disclosure can relate to methods of measurements on a resistive heating element while operating in a furnace and to real-time diagnostics and predictive failure mechanisms.

BACKGROUND

In the discussion of the background that follows, reference is made to certain structures and/or methods. However, the following references should not be construed as an admission that these structures and/or methods constitute prior art. Applicant expressly reserves the right to demonstrate that such structures and/or methods do not qualify as prior art.

Conventional methods of measuring resistance in resistive elements typically use some form of RMS or other time-averaging schemes or apply an active signal to the restive elements in order to perform a measurement. In the case of the former, the measurements are usually heavily filtered to remove noise and therefore do not provide the resolution or tracking speed that the method of this invention provides. Furthermore, these measurements tend to not be very accurate with time-proportioned (such as in the case of zero-cross synchronous control) control methods. In the case of the latter, the measurements often need to be taken when the power is not applied (which is in direct contrast to in-situ measurements made when power is applied under normal operating conditions) and can be a source of system noise depending on the signal applied to enable the measurement. In cases where the power supply is DC, it may not be desirable or possible to interrupt the voltage and current supply to take a measurement.

A method for monitoring the condition of an electric current-carrying heating element is disclosed in U.S. Pat. Nos. 6,956,489 and 7,012,538, the contents of which are incorporated herein by reference.

SUMMARY OF THE INVENTION

An exemplary embodiment of a method to determine an instantaneous resistance value of an electric circuit comprises measuring an in-situ instantaneous voltage of the circuit, measuring an in-situ instantaneous current of the circuit, and calculating the instantaneous resistance based on the measured in-situ instantaneous voltage and the measured in-situ instantaneous current.

Another exemplary embodiment of a method to determine an instantaneous resistance value of an electric circuit comprises measuring an in-situ instantaneous voltage of the circuit, measuring an in-situ instantaneous current of the circuit, measuring an in-situ instantaneous temperature of the circuit, and calculating the instantaneous resistance based on the measured in-situ instantaneous voltage and the measured in-situ instantaneous current and relating the calculated instantaneous resistance to the measured temperature.

An exemplary embodiment of a measurement system comprises a circuit to be measured, an EI measurement module, and a controller, wherein the EI measurement module is operatively connected to the circuit to be measured to measure an in-situ instantaneous voltage of the circuit and to measure an in-situ instantaneous current of the circuit, wherein the EI measurement module is operatively connected to the controller to communicate a measurement to the controller, and wherein the measurement system calculates an instantaneous resistance based on the measured in-situ instantaneous voltage and the measured in-situ instantaneous current.

It is to be understood that both the foregoing general description and the following detailed description are exemplary and explanatory and are intended to provide further explanation of the invention as claimed.

BRIEF DESCRIPTION OF THE DRAWING

The following detailed description can be read in connection with the accompanying drawings in which like numerals designate like elements and in which.

DETAILED DESCRIPTION

Figure 1:
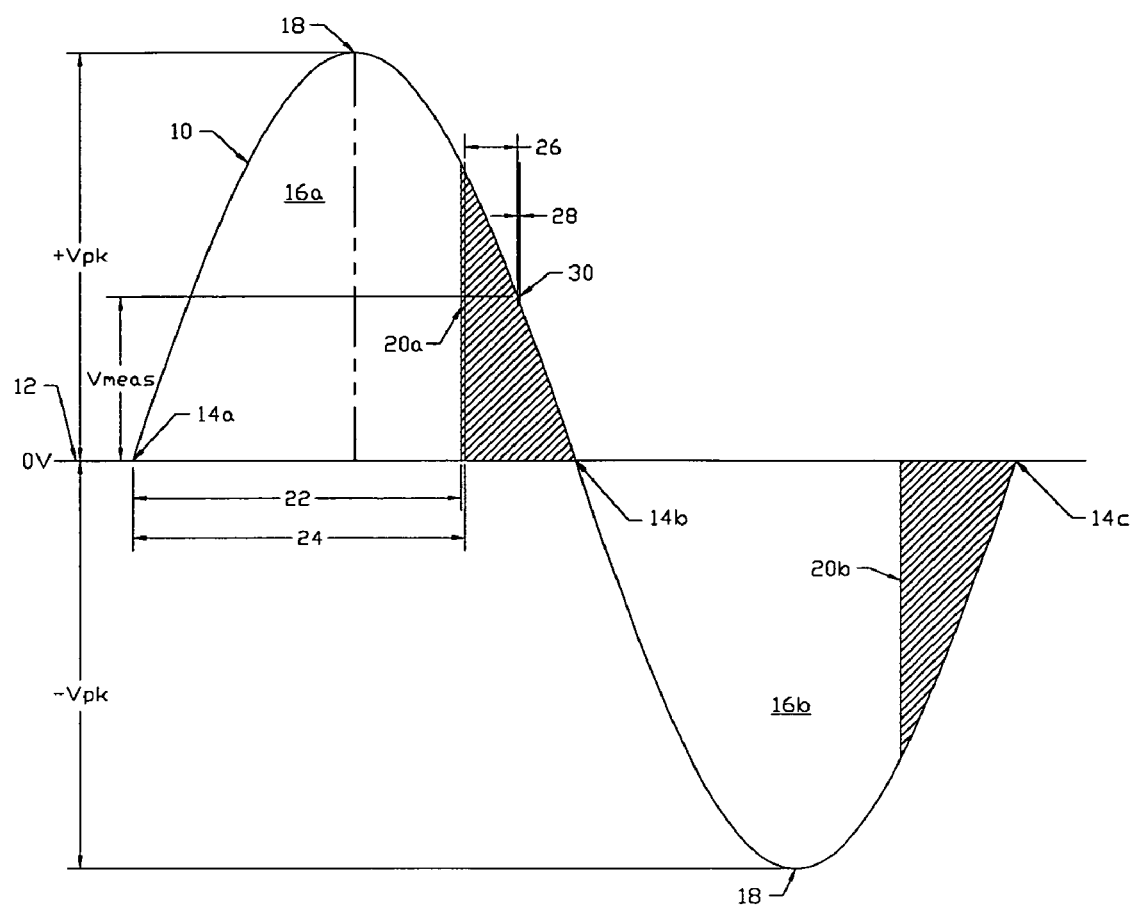
FIG. 1 depicts an exemplary measurement technique applied to a phase angle fired load.

In AC supply applications, the voltage potential between the supply lines cyclically increases from zero to the Peak Voltage with one line being more positive than the other line, then decreases back to zero over some time. The voltage then increases again to the Peak Voltage with the opposite line being more positive than the other. This cycle repeats continuously at a rate of 60 Hz for most AC supplies in the USA and at 50 Hz in some other countries. The point in time at which the AC potential between the supply lines becomes zero is referred to as the Zero Crossing point. AC voltage is typically a circular function where the instantaneous voltage is approximately the Peak Voltage multiplied by the sine($\theta$) where $\theta$ is in radians and a complete AC cycle (encompassing both the positive and negative half cycles) occurs over a period of $2\pi$ radians or 360 degrees.

An exemplary method to determine an instantaneous resistance value of an electric circuit comprises measuring an in-situ instantaneous voltage of the circuit and measuring an in-situ instantaneous current of the circuit. Based on the measured in-situ instantaneous voltage and the measured in-situ instantaneous current, the instantaneous resistance is calculated. The measured in-situ instantaneous voltage and the measured in-situ instantaneous current are measured simultaneously.

An exemplary embodiment of an in-situ measurement is a measurement of a parameter in a circuit while the circuit is electrically connected and operating and, preferably, when the circuit is operating normally and without interrupting or modifying the operating conditions.

A measurement point of the instantaneous voltage in the circuit is periodic and at a predetermined time and a consistent point from a reference point in a cycle of the voltage. For example, any time period referenced to the zero crossing point, voltage peak, voltage minimum, minimum or maximum rate of change, or time periodicity can be used. Also, a measurement point of the instantaneous current in the circuit is periodic and at a predetermined time and a consistent point in from a reference point in a cycle of the current. For example, any time period referenced to the zero crossing point, current peak, current minimum, minimum or maximum rate of change, or time periodicity can be used.

In one exemplary embodiment, the reference point is a zero crossing point of an AC waveform. In another exemplary embodiment, the predetermined time is about 6,250 μsec (±10%). In a still further exemplary embodiment, the predetermined time is at or after a peak voltage value has occurred in the cycle.

An exemplary method to determine an instantaneous resistance value of an electric circuit can optionally comprises verifying a presence of voltage in the circuit prior to measuring. Verifying the presence of the voltage contributes to avoiding erroneous measurement which would occur by including a measurement when the circuit is idle to the averaging process. Verifying can be done by, for example, a comparator circuit, either a separate circuit or incorporated into the voltage input section of the EI measurement module or into another module. In one exemplary method, a delay is implemented between verifying and measuring to avoid noise in the measurement. An example of a suitable delay is about 1,000 μsec (±10%).

As used herein, all measurements are taken during normal operating conditions by simultaneously sampling the instantaneous voltage and current values. Since the voltage and current measurements are taken simultaneously, accurate resistance measurements may be calculated by dividing the instantaneous voltage by the instantaneous current measurements.

Optionally, the temperature of the circuit can be measured. For example, an exemplary method to determine an instantaneous resistance value of an electric circuit comprises measuring an in-situ instantaneous voltage of the circuit, measuring an in-situ instantaneous current of the circuit, and measuring an in-situ instantaneous temperature of the circuit. The instantaneous resistance based on the measured in-situ instantaneous voltage and the measured in-situ instantaneous current is calculated and the calculated instantaneous resistance is related to the measured temperature. In the exemplary method, the measured in-situ instantaneous voltage, the measured in-situ instantaneous current, and the measured in-situ temperature are measured simultaneously. With respect to the measured in-situ instantaneous voltage, the measured in-situ instantaneous current, the method is similar to that described herein above. With respect to the measured in-situ instantaneous temperature, the measurement can be taken at by a thermocouple positioned proximate the circuit.

EXAMPLE

A circuit for a heating element is electrically connected to a power supply to supply 120 vac at 60 Hz to the circuit. A sync event is generated at the AC zero-crossing point and the measurement is taken after a period determined by an adjustable time delay. This insures that the measurements are always taken at the same point in time during the AC cycle and allows optional averaging over time of consecutive measurements. The measurement window is designed to be very small, e.g., less than 1%, (in one exemplary embodiment) as compared to the AC half-cycle so as to minimize the effects of the varying AC voltage during the measurement period. For example, an exemplary embodiment has a 50 μsec measurement window for an AC half-cycle of 8,333 μsec for 60 Hz and has a 50 μsec measurement window for an AC half-cycle of 10,000 μsec for 50 Hz.

For zero-crossing synchronized loads, power is applied in complete half-cycles or whole cycles and proportioned over time. Since E (voltage) and I (current) are periodic and the resultant power does not vary when examined over the control resolution (individual full or half-cycles), percent of power may be defined by the function:

$$f_{zcc}(t_{on}, t_{off}) = \frac{t_{on}}{t_{on} + t_{off}}$$

In most cases the cycle time($t_{on}+t_{off}$) is equal to 20 cycles or 333 msec. The minimum applied power in this case is usually 1/20 or 5% as can be seen in the following equation:

$$f_{zcc}(t_{on}, t_{off}) = \frac{t_{on}}{t_{on} + t_{off}}$$

$$t_{on} = \frac{1}{60 \text{ Hz}}$$

$$t_{off} = 19 \frac{1}{60 \text{ Hz}}$$

$$f_{zcc}(t_{on}, t_{off}) = 5\%$$

Any application of power to the resistive load creates a measurable (at least half-cycle) event. The preferred measurement point for zero-cross fired elements is at the peak of the AC half-cycle which occurs 4,167 μsec after the zero-cross event for a 60 Hz AC source. Another way to express this point is relating it to radians such that the peak voltage occurs at π/2 radians (90 degrees) and 3π/2 radians (270 degrees) where sine(θ)=1 and −1, respectively. At these points, the $$\frac{\partial V}{\partial T}$$

(change in voltage over time) is at a minimum, yielding the most stable measurements.

In the case of phase-angle controlled loads, delaying the point at which the voltage is applied to the load proportions each AC half cycle. The portion of the AC cycle during which voltage is applied to the load is commonly referred to as the conduction angle while the point that the conduction angle begins is referred to as the phase angle. The conduction angle encompasses the portion of the AC cycle from the phase angle to the next zero-crossing event. Since R is constant with respect to E and I and I is a function of E (the load is primarily resistive in this exemplary case), the percentage of power can be expressed as $$\frac{E_2^2}{E_1^2}.$$

In this case, since the waveform of the voltage is irregular, a more accurate representation of the power can be obtained by integrating the voltage over time. The percentage of power then becomes:

$$f_{pac}(\theta_t) = \frac{\int_{\theta_t}^{\pi} \sin(\theta)^2}{\int_0^{\pi} \sin(\theta)^2}$$

Examining a typical half-cycle, where the cycle begins with θ=0 (t=0) and ending at θ=π (τ=8,333 μsec for 60 Hz), one finds that 50% power is applied where θ=π/2 (the phase angle). One can also express the phase angle in degrees where θ=2π is the same as φ=360 degrees. This means that φ=90 degrees is the 50% power point. The calculations are as follows:

$$f_{pac}(\theta_t) = \frac{\int_{\theta_t}^{\pi} \sin(\theta)^2}{\int_0^{\pi} \sin(\theta)^2}$$

$$\theta_t = \frac{\pi}{2} = 1.571 \text{rad}$$

$$f_{pac}(\theta_t) = 50\%$$

Sync pulses can be generated by monitoring the AC supply before the energy regulation devices in the circuit. For example, this monitoring point can be a pair of SCRs connected in parallel opposition. After a period of time determined by an adjustable delay, the incoming voltage is tested to verify power has been applied. In an exemplary embodiment, the delay from sync to measurement is adjusted to about 6,250 μsec (±10%) yielding a phase angle of approximately φ=135 degrees. Examining the power at this phase angle we find:

$$f_{pac}(\theta_t) = \frac{\int_{\theta_t}^{\pi} \sin(\theta)^2}{\int_0^{\pi} \sin(\theta)^2}$$

$$\theta_t = 135 \text{ deg} = 2.356 \text{rad}$$

$$f_{pac}(\theta_t) = 9.085\%$$

This configuration allows measurements to easily be taken at power levels of 10% or higher. This covers the majority of applications since the power output during operation is usually much higher than 10%. Of course, the measurement point can be adjusted to measure at even lower percentage of outputs, if necessary, by adjusting the delay appropriately.

After an adjustable delay (set to 1,000 μsec in on exemplary embodiment) the voltage is tested again to verify it is still present. This delay functions as both a mechanism to avoid triggering on a noise impulse, and to allow some time to pass after the voltage is initially applied to allow any voltage spike upon initial voltage application to settle before measuring. If the voltage is still present, the measurement is taken. In the exemplary embodiment, the phase angle that the measurement is taken is [(6,250 μsec+1,000 μsec)/8,333 μsec]×180 degrees=156.6 degrees. The instantaneous voltage at this phase angle, $f_{Vpk}(\theta)$, is defined by:

$$f_{Vpk}(\theta) = \sin(\theta) \; \theta_t = 156.6 \text{ deg} \; f_{Vpk}(\theta_t) = 39.715\%$$

Therefore the instantaneous voltage is equal to approximately 40% of the peak voltage.

In the case of DC voltage, the exemplary system internally generates it's own period sync pulses to sample the voltage and current multiple times and average the readings. There is no issue with taking DC measurements on this system since it essentially measures peak values anyway.

FIG. 1 depicts an application of an exemplary measurement technique applied to a phase angle fired load. Examining FIG. 1, an AC power supply 10, having a line frequency of 60 Hz that is sinusoidal in shape, has a mean voltage 12 of 0 volts with recurring zero-crossing points 14a, 14b, 14c. The AC power supply 10 consists of half-cycle portions 16a, 16b that are 180 degrees or 8,333 μsec in length and having a peak voltage 18 occurring at 90 degrees or 4,166 μsec after the zero crossing points. The half-cycle portions 16a, 16b are proportioned such that the angle of conduction 20a, 20b produce a desired output power. For example, the desired output power can be at least 10% of the maximum power. In this example, the proportioning of power is accomplished by delaying the firing angle 22 to approximately 133.4 degrees or 6176 μsec in the case of 10% power output. Measurement synchronization occurs from the zero crossing points 14a, 14b, 14c. Other desired output power can be selected, such as 2%, 3%, 8%, 15%, 25%, 30%, 50%, 60%, 80% and more.

The presence of voltage is tested after delay 24. If, as in the case of FIG. 1, voltage is present, an additional delay 26 is implemented to allow for noise impulses that commonly occur at the initial application of voltage to dissipate prior to sampling the voltage during sampling period 28. Here, the delay 24 is 6,250 μsec, the additional delay is 1,000 μsec, and the sampling period 28 is 50 μsec. At the time of sampling, the measured voltage 30 is still approximately 40% of its peak value 18. Simultaneous to the voltage sampling, the current is measured such that the instantaneous values are taken at the same point in time. Division of the voltage measurement by the current measurement yields the instantaneous resistance measurement.

Figure 2:
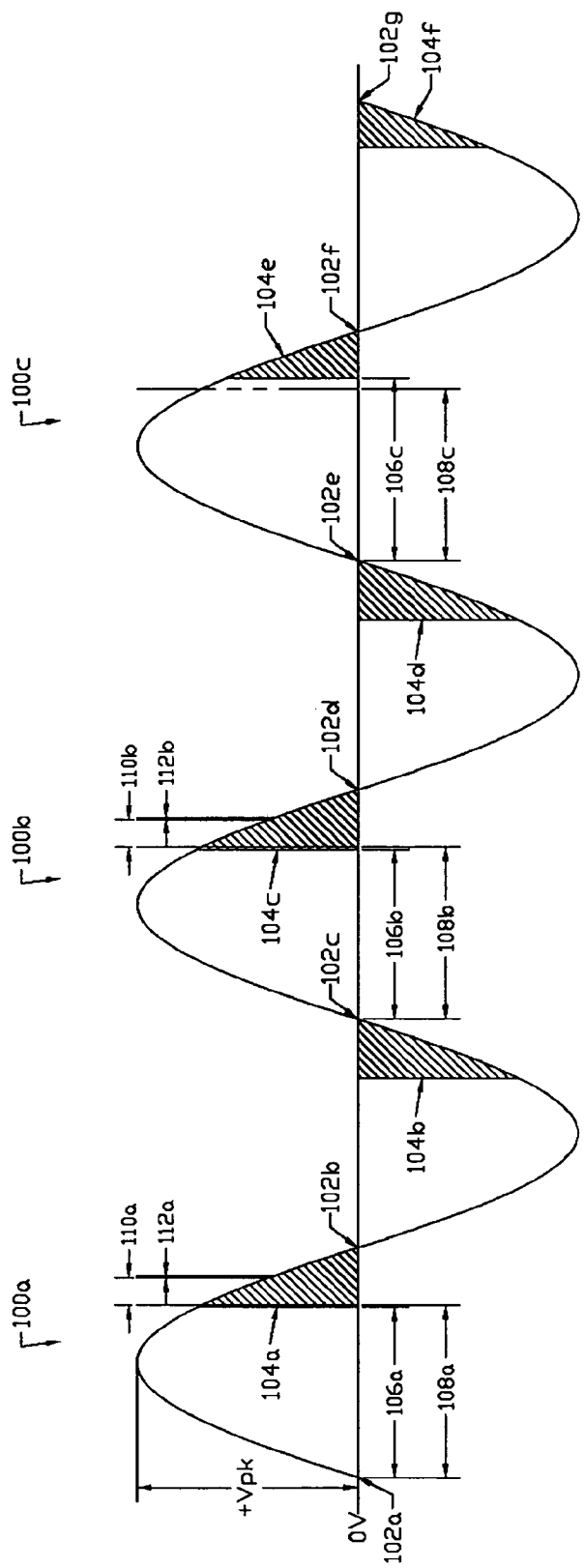
FIG. 2 illustrates an example phase angle measurement pattern over a set of cycles.

FIG. 2 illustrates an example phase angle measurement pattern over a set of cycles. Turning attention to FIG. 2, multiple consecutive AC cycles as described in FIG. 1 are shown. The multiple consecutive AC cycles 100a, 100b, 100c have multiple zero crossing points 102a, 102b, 102c, 102d, 102e, 102f, 102g and multiple conduction angle events 104a, 104b, 104c, 104d, 104e, 104f.

During the first two cycles, the firing angle 106a, 106b is 133.4 degrees or 6,176 μsec yielding angles of conduction 104a, 104b, 104c, 104d that produce an output power of approximately 10% of the maximum available power. In these cases, voltage is present at the test points 108a, 108b and therefore after delays 110a, 110b a subsequent measurement 112a, 112b is taken.

During the third exemplary cycle, the firing angle 106c is 143.8 degrees or 6,657 μsec yielding angles of conduction 104e, 104f that produce an output power of approximately 5% of the maximum available power. In these cases, voltage is not present at the test point 108c and therefore no measurement is attempted. The result of this method is that voltage and current measurements are taken simultaneously at consistent points during the AC cycles allowing subsequent measurements to be averaged over time to reduce noise since the instantaneous voltage is consistent at the point of measurement.

It should be noted that each of the delay parameters may be adjusted and therefore power levels of less than 10% could be accommodated if desired. Conversely, a higher minimum measurable power level could be selected or a shorter noise delay implemented to take measurements where the rate of change $$\left(\frac{\partial V}{\partial T}\right)$$

is at a lower value, which could also increase overall accuracy. In addition, in cases where the line frequency is different, such as 50 Hz, the time delays can be adjusted appropriately.

Figure 3:
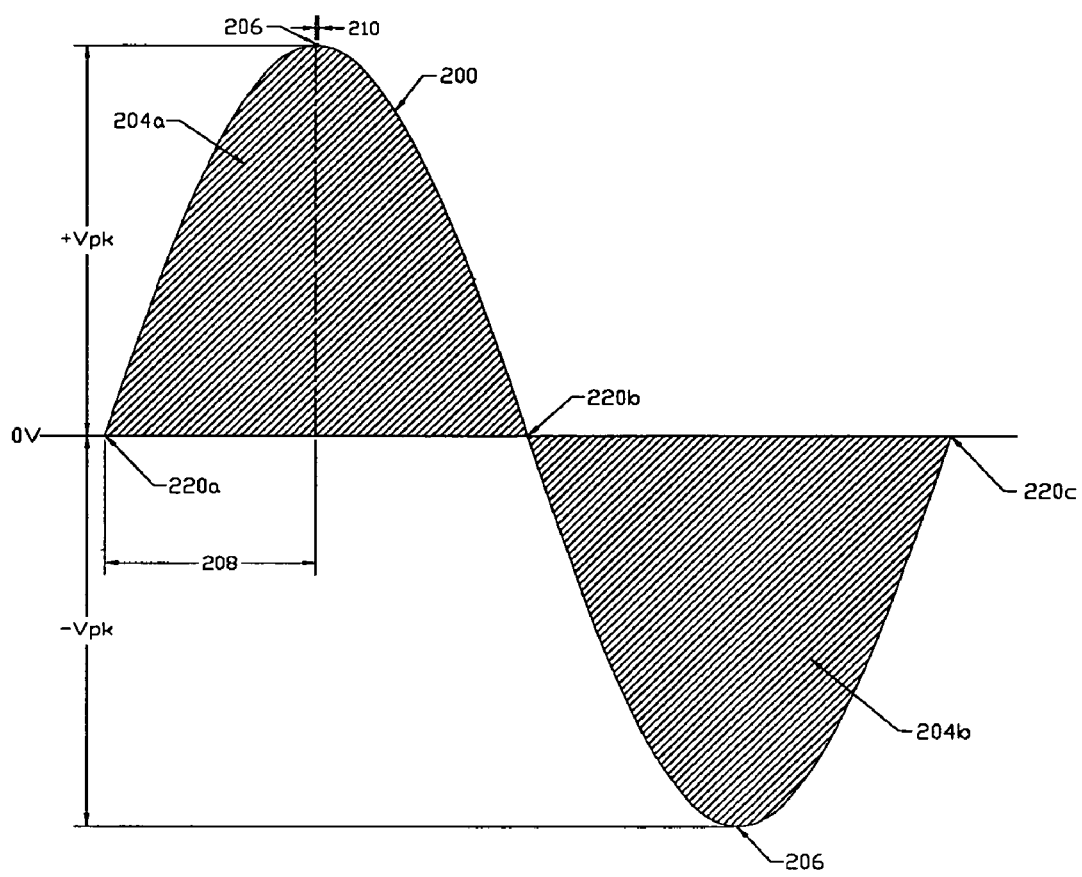
FIG. 3 depicts an exemplary measurement technique applied to a zero-cross (time proportioned) load

FIG. 3 depicts an exemplary measurement technique applied to a zero-cross (time proportioned) load. In the FIG. 3 example, the voltage is zero cross fired. An AC power supply 200 having a line frequency of 60 Hz that is sinusoidal in shape is shown. The AC power supply 200 has a mean voltage of 0v with recurring zero-crossing points 202a, 202b, 202c with half-cycle portions 204a, 204b that are 180 degrees or 8,333 μsec in length and having a peak voltage 206 occurring at 90 degrees or 4,166 μsec after the zero crossing points. The proportioning of power occurs by selectively applying voltage on alternate cycles or half-cycles over time. Measurement synchronization occurs from the zero crossing points 202a, 202b, 202c. The presence of voltage is tested at the zero crossing point 202a. After a delay 208, the voltage is sampled during sampling period 210. Here, a delay 208 of 4,166 μsec and a sampling period 210 of 50 μsec are shown. At the time of sampling, the measured voltage is at approximately 100% of its peak value, at which point the change in voltage $$\left(\frac{\partial V}{\partial T}\right)$$

is approximately zero. Simultaneous to the voltage sampling, the current is measured such that the instantaneous values are taken at the same point in time. Division of the voltage measurement by the current measurement yields the instantaneous resistance measurement.

Figure 4:
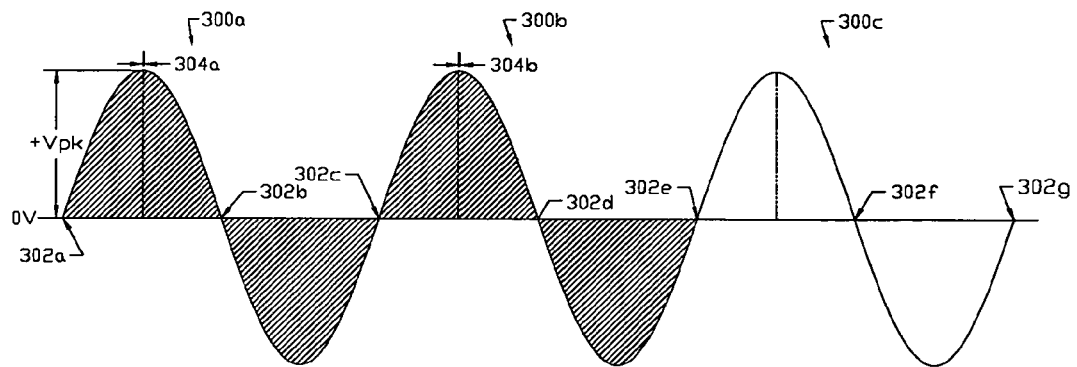
FIG. 4 illustrates an example zero-cross fired measurement pattern over a set of cycles.

FIG. 4 illustrates an example zero-cross fired measurement pattern over a set of cycles. In the FIG. 4 example, multiple consecutive AC cycles as described in FIG. 3 are shown. The multiple consecutive AC cycles 300a, 300b, 300c have multiple zero crossing points 302a, 302b, 302c, 302d, 302e, 302f, 302g with voltage proportioned over time. During the first two cycles, voltage has been selectively applied to the load. In these cases, subsequent measurements 304a, 304b are taken at the peak of the half-cycles at the peak voltage 306. Here, the peak voltage is 169.7 volts and the change in voltage $$\left(\frac{\partial V}{\partial T}\right)$$

is approximately zero.

During the third exemplary cycle, voltage is not applied to the load therefore no measurement is attempted. The result of this method is that voltage and current measurements are taken simultaneously at consistent points during the AC cycles allowing subsequent measurements to be averaged over time to reduce noise since the instantaneous voltage is consistent at the point of measurement. It should be noted that in cases where the line frequency is different, such as 50 Hz, the time delays could be adjusted appropriately.

In the previously cited examples (as illustrated in FIGS. 1 to 4), 169.7 v peak and 60 Hz were chosen to illustrate a typical example. However, these parameters are for illustrative purposes only and other voltages and configurations, such as 60 Hz or DC voltage, could be accommodated in a similar fashion.

An exemplary measurement system comprises a circuit to be measured, an EI measurement module and a controller. The EI measurement module is operatively connected to the circuit to be measured to measure an in-situ instantaneous voltage of the circuit and to measure an in-situ instantaneous current of the circuit. The EI measurement module is also operatively connected to the controller to communicate the measurements to the controller for further analysis. The measurement system calculates an instantaneous resistance based on the measured in-situ instantaneous voltage and the measured in-situ instantaneous current.

An optional temperature measurement module can be included in the exemplary measurement system. The temperature measurement module is operatively connected to the circuit to measure instantaneous temperature. An optional communications bus can also be included in the exemplary measurement system. For example, the EI measurement module and/or the temperature measurement module can be operatively connected to the controller through the communications bus to facilitate multiple zones of monitoring.

Figure 5:
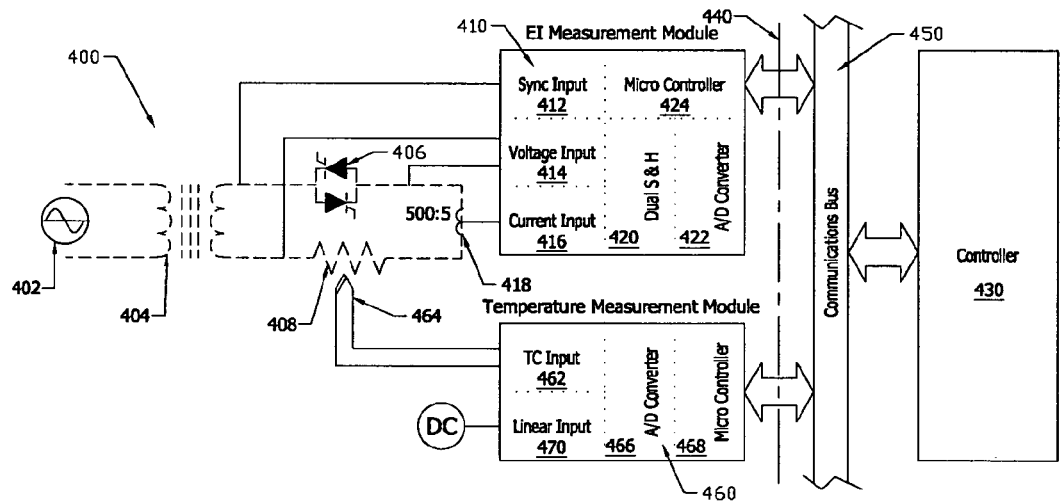
FIG. 5 is a block functional diagram representing an exemplary embodiment of a measurement system.

FIG. 5 is a block functional diagram representing an exemplary embodiment of a measurement system 400. The dashed components 402, 404, 406, 408 are part of the circuit being measured, which itself is part of a larger system such as a heating element or thermal processing system. The dashed components 402, 404, 406, 408 are representative in nature, are not inclusive of the measurement system, per se, and are included in FIG. 5 to show the interface of the measurement system 400 to the system under measurement.

In the FIG. 5 exemplary embodiment, an AC voltage 402 is reduced to a desirable voltage and isolated from the load by transformer 404. The reduced voltage is proportioned to the resistive load 408 by the power-proportioning device 406. The measurement system 400 consists of an EI (voltage–current) measurement module 410 comprised of a sync input detector 412 that monitors the reduced voltage prior to the power-proportioning device 406. The sync input detector detects the zero-crossing event to which all of the subsequent timing is related. The voltage input section 414 both provides confirmation of the signal voltage being present via a comparator and the actual signal conditioning for the voltage input measurement. Instantaneous current input is obtained by current input section 416 from the current transformer 418 (or alternately a resistive shunt—not shown). The dual S & H circuit (sample and hold circuit) 420 simultaneously measures the instantaneous voltage and current signals and provides its output to the A/D converter 422. A micro controller 424 performs the resistance calculation as well as all measurement timing, scaling and communications to the main controller 430 across a galvanic isolation barrier 440 via communications bus 450.

Optional temperature measurements are synchronously measured by the temperature measurement module 460. The temperature measurement module 460 includes one or more TC input amplifiers 462 which condition the temperature measurement signal provided by the thermocouple 464. The A/D converter 466 digitizes the temperature measurement after which it is scaled by the micro controller 468 that in turn communicates the temperature value to the main controller 430 across a galvanic isolation barrier, which may be the same as or different from galvanic isolation barrier 440, via a communications bus, which may be the same or different from communications bus 450. A second linear input 470 is provided to facilitate cases where a linear input such as 0-5 vdc can be provided that indicates the resistive element temperature, such as a signal from an optical pyrometer or other similar source.

The elements disclosed herein can be scaled to accommodate multiple zones of resistive heating elements connected to a single main controller as well as multiple main controllers integrated to create a network of many measurement points.

Although described in connection with preferred embodiments thereof, it will be appreciated by those skilled in the art that additions, deletions, modifications, and substitutions not specifically described may be made without department from the spirit and scope of the invention as defined in the appended claims.

What is claimed is:

1. A method to determine an instantaneous resistance value of an electric circuit, the method comprising:
    generating a synchronizing event at a zero-crossing point of an AC source waveform;
    waiting a delay period, the delay period based on a frequency of the AC source waveform;
    simultaneously measuring an in-situ instantaneous voltage of the circuit and measuring an in-situ instantaneous current of the circuit; and
    calculating the instantaneous resistance for the electric circuit at a portion of the AC source waveform selected by the delay period based on the measured in-situ instantaneous voltage and the measured in-situ instantaneous current.

2. The method of claim 1, wherein the delay period is about 6,250 μsec.

3. The method of claim 1, wherein measuring the in-situ instantaneous voltage is after a peak voltage value has occurred in the AC source waveform.

4. The method as in claim 2 or 3, comprising verifying a presence of voltage in the circuit prior to measuring.

5. The method of claim 4, comprising implementing a delay between verifying and measuring to avoid noise in the measurement.

6. The method of claim 5, wherein the delay is about 1,000 μsec.

7. The method of claim 1, wherein measuring the in-situ instantaneous voltage is at the peak voltage point in the AC source waveform.

8. The method of claim 1 comprising
    measuring an in-situ instantaneous temperature of the circuit; and
    relating the calculated instantaneous resistance to the measured temperature.

9. The method of claim 8, wherein the measured in-situ instantaneous voltage, the measured in-situ instantaneous current, and the measured in-situ temperature are measured simultaneously.

10. A measurement system, comprising:
    a circuit to be measured;
    an EI measurement module;
    a zero crossing detector; and
    a controller,
    wherein the EI measurement module is operatively connected to the circuit to be measured to passively measure an in-situ instantaneous voltage of the circuit and to passively measure an in-situ instantaneous current of the circuit simultaneously,
    wherein the EI measurement module is operatively connected to the controller to communicate a measurement to the controller,
    wherein the zero crossing detector synchronizes the measurements of the EI measurement module to a source waveform of the circuit to be measured, and
    wherein the measurement system calculates an instantaneous resistance based on the measured in-situ instantaneous voltage and the measured in-situ instantaneous current.

11. The measurement system of claim 10, comprising a communications bus, wherein the EI measurement module is operatively connected to the controller through the communications bus to facilitate multiple zones of monitoring.

12. The measurement system of claim 10, comprising a temperature measurement module, wherein the temperature measurement module is operatively connected to the circuit to measure instantaneous temperature and is operatively connected to the controller to communicate a measurement to the controller.

13. The measurement system of claim 12, comprising a communications bus, wherein the temperature measurement module is operatively connected to the controller through the communications bus to facilitate multiple zones of monitoring.

14. A method to determine an instantaneous resistance value of an electric circuit, the method comprising:
    detecting an event in a cycle of an AC power supply of the electric circuit;
    waiting a period of time, the period of time based on a length of time of the cycle;
    generating a signal outside the electric circuit;
    in response to the generated signal, simultaneously measuring an in-situ instantaneous voltage of the electric circuit and measuring an in-situ instantaneous current of the electric circuit, the measuring occurring during a portion of the cycle determined by the period of time; and
    calculating the resistance of the electric circuit based on the measured voltage and the measured current.

15. The method of claim 14, wherein the event is selected from the group comprising: a zero crossing point, a voltage peak, a voltage minimum, a minimum rate of change, and a maximum rate of change.

16. The method of claim 14, wherein simultaneously and calculating comprise:
    testing if there is a voltage in the electric circuit;
    if there is a voltage in the electric circuit, then
    waiting another period of time, the another period of time permitting voltage spikes to settle down in a case where the AC power was just switched on,
    simultaneously measuring an in-situ instantaneous voltage of the electric circuit and measuring an in-situ instantaneous current of the electric circuit, the measuring occurring during a small portion of the cycle determined by the period of time and the another period of time, and
    calculating the resistance of the electric circuit based on the measured voltage and the measured current.

17. The method of claim 16, further comprising:
    repeating the method several times; and
    averaging the calculated resistance to calculate an average resistance.

18. The method of claim 14, wherein simultaneously comprises:
simultaneously measuring an in-situ instantaneous voltage of the electric circuit and measuring an in-situ instantaneous current of the electric circuit, the measuring occurring during a small portion of the cycle, the small portion being less than one percent of the cycle.

19. The method of claim 14, wherein calculating comprises:
calculating the resistance of the electric circuit based on the measured voltage and the measured current and based on the period of time.

\* \* \* \* \*